(12) United States Patent
Van Der Werf et al.

(10) Patent No.: US 7,492,443 B2
(45) Date of Patent: *Feb. 17, 2009

(54) DEVICE MANUFACTURING METHOD, DEVICE MANUFACTURED THEREBY AND A MASK FOR USE IN THE METHOD

(75) Inventors: Jan Evert Van Der Werf, Waalre (NL); Erik Roelof Loopstra, Heeze (NL); Hans Meiling, Bilthoven (NL); Johannes Hubertus Josephina Moors, Helmond (NL); Martinus Hendrikus Antonius Leenders, Rotterdam (NL)

(73) Assignee: ASML Netherlands B.V., Veldhoven (NL)

( * ) Notice: Subject to any disclaimer, the term of this patent is extended or adjusted under 35 U.S.C. 154(b) by 622 days.

This patent is subject to a terminal disclaimer.

(21) Appl. No.: 11/023,359

(22) Filed: Dec. 29, 2004

(65) Prior Publication Data

US 2005/0146703 A1 Jul. 7, 2005

Related U.S. Application Data

(63) Continuation of application No. 10/173,559, filed on Jun. 18, 2002, now Pat. No. 6,879,374.

(30) Foreign Application Priority Data

Jun. 20, 2001 (EP) .................................. 01305341

(51) Int. Cl.
| | |
|---|---|
| *G03B 27/68* | (2006.01) |
| *G03B 27/42* | (2006.01) |
| *G03F 9/00* | (2006.01) |
| *G03C 5/00* | (2006.01) |

(52) U.S. Cl. ............................. 355/72; 355/53; 430/22; 430/30

(58) Field of Classification Search ................... 355/52, 355/53, 75; 430/22, 30
See application file for complete search history.

(56) References Cited

U.S. PATENT DOCUMENTS

| | | | |
|---|---|---|---|
| 5,153,898 | A | 10/1992 | Suzuki et al. |
| 5,222,112 | A | 6/1993 | Terasawa et al. |

(Continued)

FOREIGN PATENT DOCUMENTS

EP 1 037 117 A2 9/2000

(Continued)

OTHER PUBLICATIONS

The European Search Report dated Dec. 21, 2001 issued in a counterpart European Application No. EP 01 30 5341.

*Primary Examiner*—Alan A Mathews
(74) *Attorney, Agent, or Firm*—Sterne, Kessler, Goldstein & Fox P.L.L.C.

(57) ABSTRACT

A device manufacturing method according to one embodiment of the invention includes positioning a reflective patterning structure to reflect at least a portion of a beam of radiation as a patterned beam of radiation having a pattern in its cross-section. The method also includes using a projection system to project the patterned beam of radiation to form an image on a target portion of a layer of radiation-sensitive material. Positioning includes at least one among shifting and tilting a nominal reflective surface of the reflective patterning structure with respect to a nominal object plane of the projection system according to a distortion value.

15 Claims, 4 Drawing Sheets

U.S. PATENT DOCUMENTS

| | | | |
|---|---|---|---|
| 5,229,872 A | 7/1993 | Mumola | |
| 5,257,139 A | 10/1993 | Higuchi | |
| 5,296,891 A | 3/1994 | Vogt et al. | |
| 5,328,784 A | 7/1994 | Fukuda | |
| 5,337,097 A | 8/1994 | Suzuki et al. | |
| 5,523,193 A | 6/1996 | Nelson | |
| 5,657,130 A | 8/1997 | Shirasu et al. | |
| 5,691,541 A | 11/1997 | Ceglio et al. | |
| 5,933,183 A | 8/1999 | Enomoto et al. | |
| 5,969,441 A | 10/1999 | Loopstra et al. | |
| 6,014,421 A | 1/2000 | Chiba et al. | |
| 6,046,792 A | 4/2000 | Van Der Werf et al. | |
| 6,060,224 A | 5/2000 | Sweatt et al. | |
| 6,084,673 A | 7/2000 | Van Den Brink et al. | |
| 6,118,588 A | 9/2000 | Yamamoto | |
| 6,262,792 B1 | 7/2001 | Higashiki | |
| 6,323,982 B1 | 11/2001 | Hornbeck | |
| 6,356,340 B1 | 3/2002 | Spence | |
| 6,359,678 B1 | 3/2002 | Ota | |
| 6,406,820 B1 * | 6/2002 | Ota | 430/30 |
| 6,552,779 B2 | 4/2003 | Mei | |
| 6,556,648 B1 | 4/2003 | Bal et al. | |
| 6,879,374 B2 | 4/2005 | Van Der Werf et al. | |
| 6,940,582 B1 * | 9/2005 | Tanaka | 355/53 |
| 7,088,468 B1 * | 8/2006 | Thuren | 358/1.7 |

FOREIGN PATENT DOCUMENTS

| | | |
|---|---|---|
| EP | 1 061 561 A | 12/2000 |
| EP | 1 065 532 A2 | 1/2001 |
| EP | 1 065 568 A2 | 1/2001 |
| EP | 1 137 054 A | 9/2001 |
| EP | 1 146 395 A2 | 10/2001 |
| EP | 1 679 551 A1 | 7/2006 |
| JP | WO 01/22480 | 3/2001 |
| WO | WO 98/33096 A1 | 7/1998 |
| WO | WO 98/38597 A2 | 9/1998 |
| WO | WO 98/40791 A1 | 9/1998 |
| WO | WO 99/45581 A1 | 9/1999 |

* cited by examiner

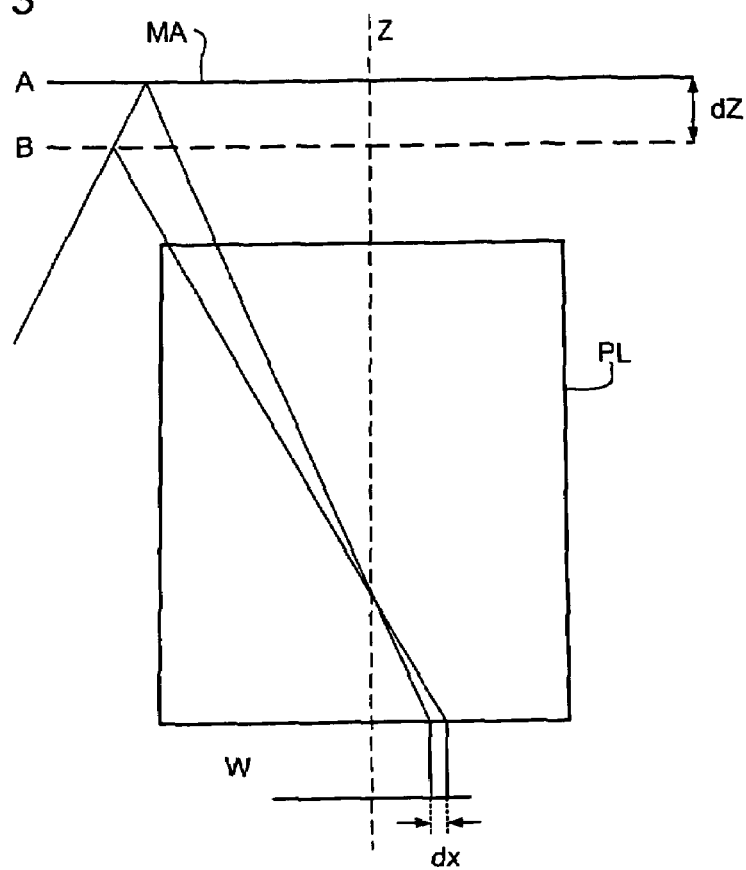
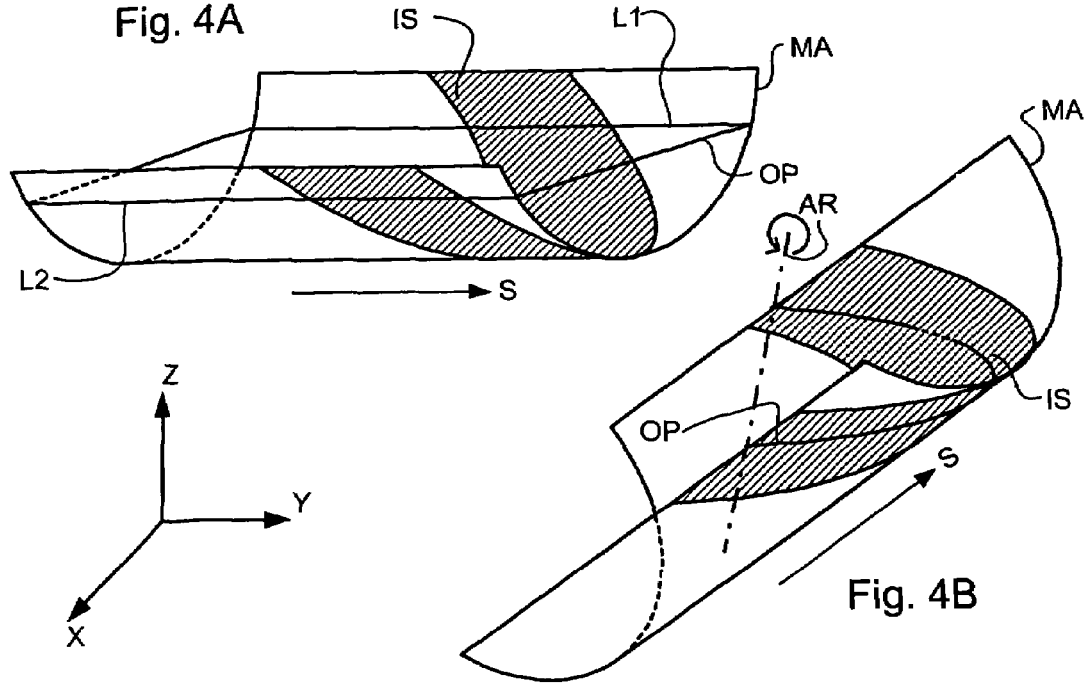

ial circuit or other device (see below). Examples of such
DEVICE MANUFACTURING METHOD, DEVICE MANUFACTURED THEREBY AND A MASK FOR USE IN THE METHOD This application claims priority to EP 01305341.8 filed Jun. 20, 2001, and U.S. patent application Ser. No. 10/173,559 filed Jun. 18, 2002, which issued as U.S. Pat. No. 6,879,374 on Apr. 12, 2005, both of which documents are hereby incorporated by reference.

FIELD OF THE INVENTION

The present invention relates to lithographic projection equipment and methods and to products of such equipment and methods.

BACKGROUND

The term "patterning structure" as here employed should be broadly interpreted as referring to any structure or field that may be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning structure may include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface.

An alternative embodiment of a programmable mirror array employs a matrix arrangement of very small (possibly microscopic) mirrors, each of which can be individually tilted about an axis by applying a suitable localized electric field, or by employing piezoelectric actuation structure. For example, the mirrors may be matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic circuitry. In both of the situations described hereabove, the patterning structure can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference. In the case of a programmable mirror array, the said support structure may be embodied as a frame or table, for example, which may be fixed or movable as required.

A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning structure as hereabove set forth.

Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. comprising one or more dies) on a substrate (e.g. a wafer of silicon or other semiconductor material) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

The term "projection system" should be broadly interpreted as encompassing various types of projection system, including refractive optics, reflective optics, and catadioptric systems, for example. For the sake of simplicity, the projection system may hereinafter be referred to as the "lens". The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, incorporated herein by reference.

In order to meet the continual demand of manufacturers of semiconductor devices to be able to produce ever smaller features, it has been proposed to use Extreme Ultraviolet (EV) radiation, e.g. with a wavelength in the range of 5 to 20 nm, as the exposure radiation in a lithographic projection apparatus. Not least among the problems in designing such an apparatus is the creation of "optical" systems to illuminate the patterning structure evenly and to project the image of the pattern defined by the patterning structure accurately onto the substrate. Part of the difficulties in producing the necessary illumination and optical systems lies in the fact that no material suitable for making refractive optical elements at EUV wavelengths is presently known. Thus, the mask must be reflective.

One problem associated with the use of a reflective mask is that it must be illuminated at an angle. Vertical (Z) displacements and tilts about the horizontal axes (Rx, Ry) of the mask (caused, e.g., by local deformations in the mask) may cause horizontal (X and Y) displacements of the image on the substrate. Such horizontal displacements can cause overlay errors, such that the projected image does not properly line up with previously printed process layers.

WO 01/22480 (EP 1 137 054 A1) and WO 99/45581 (EP 1 061 561 A1) disclose lithographic apparatus in which the plane of the mask is controlled to be as close as possible to the object plane of the projection system to reduce or eliminate overlay errors caused by magnification changes.

Further, previously printed layers may have become distorted in subsequent steps of the device manufacturing process. Yet further, the projection system may also introduce imaging errors, giving rise to imaging and overlay errors in a printed layer. It would be advantageous to have a means to adapt to such distorted previous layers or to counteract at least partially distortions introduced by the projection system.

SUMMARY

In a device manufacturing method according to at least one embodiment of the invention as applied to a lithographic apparatus having a projection system that is non-telecentric on the object side, imaging and/or overlay errors caused by deformations of the mask and/or by distortions introduced elsewhere in the lithographic process may be prevented or reduced and/or to be able to adapt to or compensate for distortions introduced elsewhere.

A device manufacturing method according to one embodiment of the invention includes providing a beam of radiation and positioning a reflective patterning structure to reflect at least a portion of the provided beam as a patterned beam of radiation having a pattern in its cross-section. This method also includes using a projection system to project the patterned beam of radiation to form an image on a target portion of a layer of radiation-sensitive material that at least partially covers a substrate. In this method, positioning includes at least one among shifting and tilting a nominal reflective surface of the reflective patterning structure with respect to a nominal object plane of the projection system according to a distortion value.

Such a method may be performed using a projection system that is non-telecentric on the object side.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or, 126 nm) and EUV (extreme ultra-violet radiation, e.g. having a wavelength in the range 5-20 nm), as well as particle beams, such as ion beams or electron beams. Also, embodiments of the invention are described in relation to an orthogonal XYZ coordinate system in which rotations about an axis I are denoted $R_i$. The X and Y axes may be described as horizontal and the Z axis as vertical but this is not to be taken as implying any necessary physical orientation of the apparatus.

BRIEF DESCRIPTION OF THE DRAWINGS

Embodiments of the invention will now be described, by way of example only, with reference to the accompanying schematic drawings in which:

FIG. 3 is a diagram illustrating how vertical displacements of the reflective mask may cause horizontal displacements of the image projected by the projection system; and FIGS. 4A and B illustrate effects of rotation of the mask;

In the Figures, corresponding reference symbols indicate corresponding parts.

DETAILED DESCRIPTION

Figure 1:
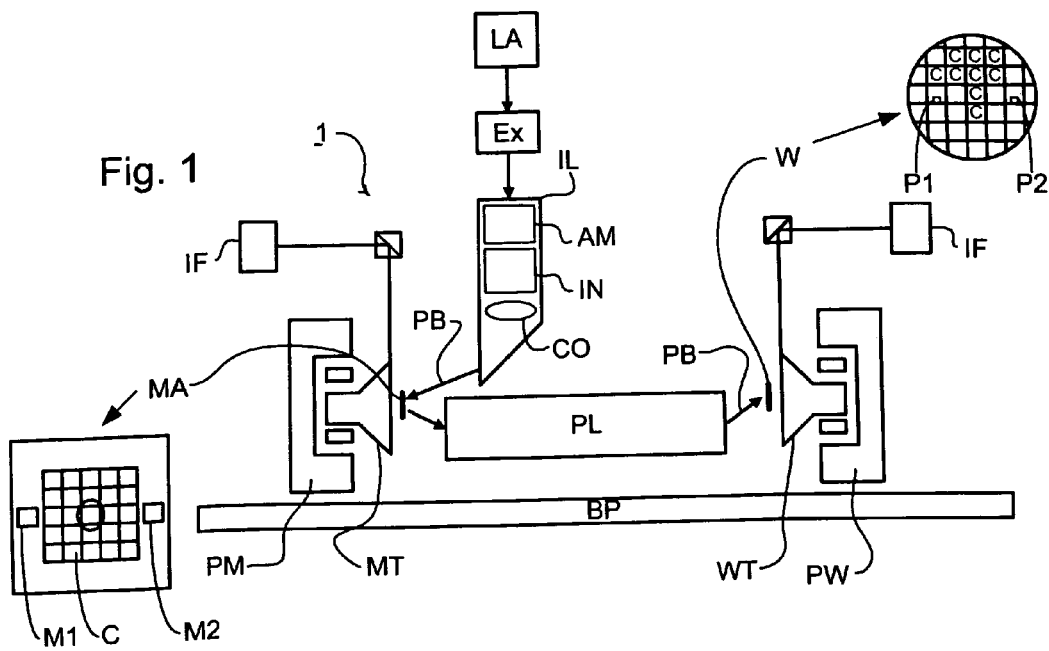
FIG. 1 depicts a lithographic projection apparatus according to an embodiment of the invention.

FIG. 1 schematically depicts a lithographic projection apparatus according to one embodiment of the invention. The apparatus comprises:

A radiation system Ex, IL, for supplying a projection beam PB of radiation (e.g. EUV radiation). In this particular example, the radiation system also comprises a radiation source LA;

A first object table (mask table) MT provided with a mask holder for holding a mask MA (e.g. a reticle), and connected to a first positioning structure for accurately positioning the mask with respect to item PL;

A second object table (substrate table) WT provided with a substrate holder for holding a substrate W (e.g. a resist-coated silicon wafer), and connected to a second positioning structure for accurately positioning the substrate with respect to item PL;

A projection system ("lens") PL (e.g. a mirror group or other reflective design) for imaging an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example (with a transmissive mask). Alternatively, the apparatus may employ another kind of patterning structure, such as a programmable mirror array of a type as referred to above.

The source LA (e.g. a mercury lamp, an excimer laser, or a laser-produced or discharge plasma source) produces a beam of radiation. This beam is fed into an illumination system (illuminator) IL, either directly or after having traversed a conditioning structure or field, such as a beam expander Ex, for example. The illuminator IL may comprise adjusting structure or field AM for setting the outer and/or inner radial extent (commonly referred to as σ-outer and σ-inner, respectively) of the intensity distribution in the beam, which may affect the angular distribution of the radiation energy delivered by the projection beam at, for example, the substrate. In addition, the apparatus will generally comprise various other components, such as an integrator IN and a condenser CO. In this way, the beam PB impinging on the mask MA has a desired intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having been selectively reflected by the mask MA, the beam PB passes through the lens PL, which focuses the beam PB onto a target portion C of the substrate W. With the aid of the second positioning structure (and interferometric measuring structure IF), the substrate table WT can be moved accurately, e.g. so as to position different target portions C in the path of the beam PB. Similarly, the first positioning structure can be used to accurately position the mask MA with respect to the path of the beam PB, e.g. after mechanical retrieval of the mask MA from a mask library, or during a scan. In general, movement of the object tables MT, WT will be realized with the aid of a long-stroke module (course positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

1. In step mode, the mask table MT is kept essentially stationary, and an entire mask image is projected at once (i.e. in a single "flash") onto a target portion C. The substrate table WT is then shifted in the x and/or y directions so that a different target portion C can be irradiated by the beam PB;

2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

As noted above, no material suitable for making refractive optical elements at EUV wavelengths is presently known. Thus, the mask must be reflective, and it may also be necessary or desirable for the illumination and projection systems to include mirrors. One problem associated with the use of a reflective mask is that such a mask must be illuminated at an angle, e.g. of approximately 6°. As a result, the projection system cannot be telecentric on the mask (object) side.

Figure 2:
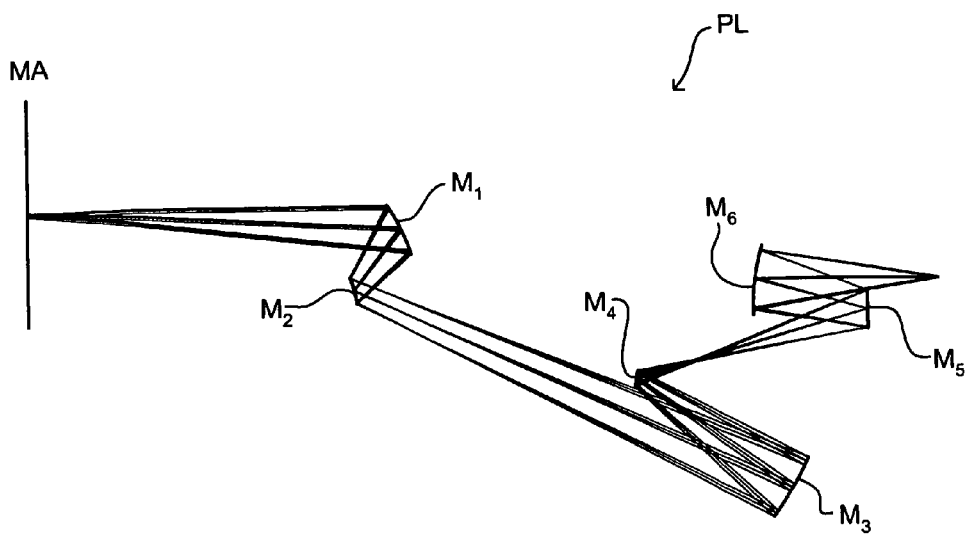
FIG. 2 depicts an example of a projection system of such an apparatus.

FIG. 2 shows a six-mirror system as included in one example of a projection system PL. The object side of this projection system is non-telecentric, since the illumination field on the mask is shifted off-axis from the projection system and the projection beam enters the projection system PL at an angle with respect to the optical axis of the projection system. The illumination field may be arc-shaped. Further details of the projection system, and alternative projection systems, can be found in European Patent Application No 00309871.2, which document is hereby incorporated by reference. The mirrors $M_1$ to $M_6$ may be multilayer mirrors as described in European Patent Applications EP-A-1 065 532 and EP-A-1 065 568, which documents are hereby incorporated by reference.

Because the mirror system shown in FIG. 2 is not telecentric on the object side, although the deviation from telecentricity is arranged to be as small as possible, local vertical (Z) deformations of the mask result in horizontal (X or Y) distortions of the image at substrate level. This effect is illustrated in FIG. 3. In this example, a vertical displacement dZ of the mask results in a horizontal displacement dx at substrate level, resulting in an overall reduction in the size of the image projected on the substrate and to overlay errors. The size of the horizontal distortion is reduced because the projection system PL has a magnification of ±¼ or ±⅕ but is nevertheless significant.

FIG. 4A shows an example of a mask MA that has a cylindrical distortion relative to the horizontal object plane OP of the projection system PL. It will be seen in this case that when mask MA is put at a position such that its mean or nominal surface is at an optimum position relative to the object plane, mask MA lies in the object plane OP only along two lines L1, L2. The illumination field IS is shown in FIG. 4A by hatching. It will be seen that most of the illumination field IS lies above or below the object plane OP and will therefore be distorted.

In a method according to one embodiment of the invention, the mask MA is rotated so that the intersection between the mask MA and object plane OP forms an arc lying close to the center of the illumination field IS, as shown in FIG. 4B. A scanning direction S is similarly rotated so that the intersection between mask MA and object plane OP remains in the center of the illumination field IS. Rotation and scanning of the mask can be performed by the first positioning structure PM under appropriate software control. It should be noted that in FIGS. 4A and B the degree of curvature of the mask, and hence the amount of rotation, have been grossly exaggerated for illustrative purposes.

Figure 5:
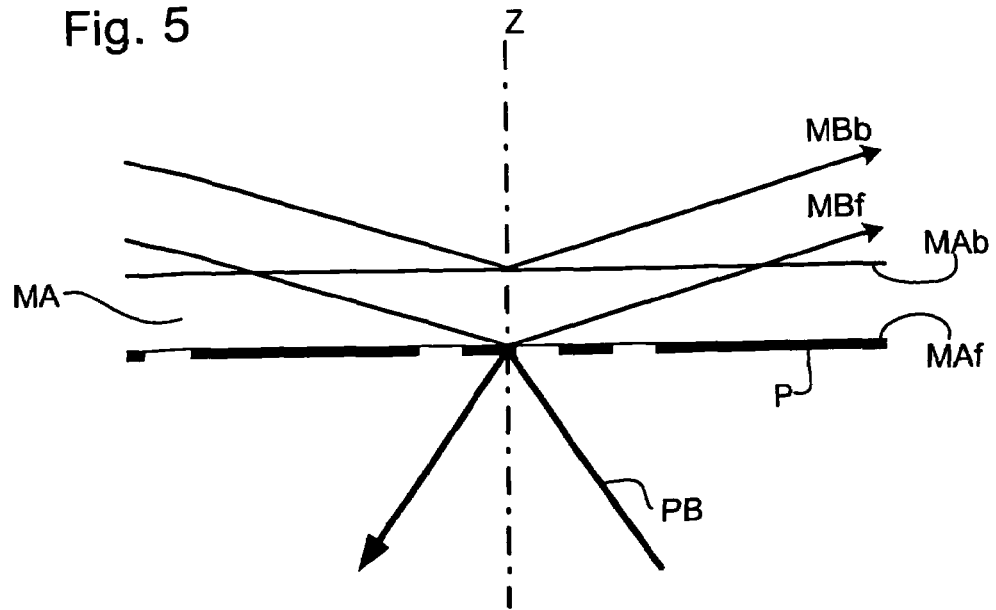
FIG. 5 is a diagram illustrating a technique of measuring the vertical position of a reflective mask having a transparent substrate.

To determine the deformation of the mask, an optical sensor (such as those disclosed in European Patent Applications EP-A-1 037 117 and 01303299.0, which documents are hereby incorporated by reference) or a capacitive sensor can be used. Alternatively, where the mask is built on a transparent substrate, a measurement may be taken from the rear, as illustrated in FIG. 5. As there shown, a first measurement beam MBf is used to measure the Z position of the front surface MAf of the mask MA, on which the pattern P is provided. A second beam MBb is used to measure the Z position of the back surface MAb of the mask MA and to correct the measurement of the Z position of the front surface MAf. One possible advantage of this measurement technique is to remove the effect of any variation in the substrate thickness. It will be appreciated that the measurement of the mask deformation and the calculation of the necessary corrective tilt can be carried out during scanning, on-the-fly leveling, or in advance, on-axis or off-axis.

A further alternative is to use markers on the mask whose Z position can be accurately determined. Conventionally, a mask is provided with a small number of image sensor markers TISm which are used to determine the plane of best focus at substrate level and/or alignment of the mask to the substrate table. For this purpose, an image sensor (for instance, a transmission image sensor TIS) is provided in the substrate table and is scanned through the aerial image of the marker TISm to determine the position of the plane of best focus.

Figure 6:
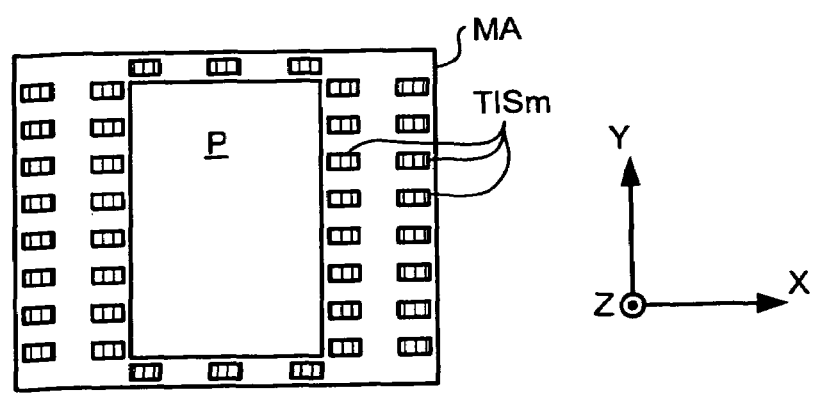
FIG. 6 is a diagram showing the position of markers used in an alternative technique for measuring the vertical position of the mask.

In a method according to one embodiment of the invention, a TIS sensor provided in the substrate table is maintained stationary, and the various markers TISm are projected onto it and scanned vertically to determine the position at which they are best focused onto the TIS sensor. This operation gives information as to the relative vertical positions of the various markers TISm. Provided that a sufficient number of markers TISm is provided on the mask, the information of their vertical positions can be interpolated to give a height map of the mask. Preferably therefore, the mask is provided with a plurality of markers TISm surrounding the pattern area P, as shown in FIG. 6.

A yet further alternative is to use one or more interferometers to measure the position of the top side of the mask MA as it is scanned on the mask table MT. In most cases the mask will be sufficiently reflective at a convenient wavelength that can be used in an interferometer.

For a flat reflective reticle, three TISm markers (one at one side of the mask pattern and two at the other side with respect to the scan direction) would prove sufficient to determine its initial Z-position and rotation around X and Y axes, but may not provide a solution that is numerically stable. To achieve numerical stability, the number of markers is increased to six, for instance. Three markers at one side of the mask pattern and three at the other side (with respect to the scan direction) prove sufficient, also to determine one or more values characterizing a cylindrical distortion of the mask about the scan direction. More markers may prove advantageous (five at either side, for instance). To determine values characterizing a cylindrical distortion along the scan direction, at least one extra mark at a side of the mask pattern along the scan direction may be required. More markers (e.g. as shown in FIG. 6) will provide better results. A numerical fit to the results (a least-squares fit, for example) will yield a mask shape to be taken into account while scanning, as described, for positioning the illuminated part of the mask in or closer to the object plane of the lens.

Although the examples described include a cylindrical mask distortion and an arc-shaped illumination field, methods according to embodiments of the invention may also be employed with different distortion shapes and/or illumination field of other shapes.

In a further alternative, a test mask is used. In many cases, the major contributors to mask distortions are distortions in the mask table, which will be the same for all masks used in the apparatus. Accordingly these distortions can be calibrated using a test mask with a large number of TIS markers arranged across its surface. The results obtained with the test mask can be applied directly to actual masks of similar materials and thickness but may need to be corrected for reticles of different materials or substantially different thicknesses.

In a method according to a further embodiment of the invention, which may be performed as described above save for the differences set forth below, the position and orientation of the mask are adjusted to compensate for distortions elsewhere in the system. Distortions that can be compensated for in this way include distortions in the projection system PL and distortions in the dies on the substrate (e.g. due to previous processing steps). For instance, such a method may be used with layers that were imaged by another lithographic projection system that has introduced some distortion.

FIGS. 7 to 12 illustrate effects that may be obtained at substrate level by various movements of the mask in a scanning lithographic projection apparatus having a arc-shaped illumination field. In these Figures the arrow tails are fixed at the nominal positions of an array of points (i.e. where they would be imaged without distortion), and the arrow heads point to the positions where the points are imaged when the relevant distortion is present.

Figure 7:
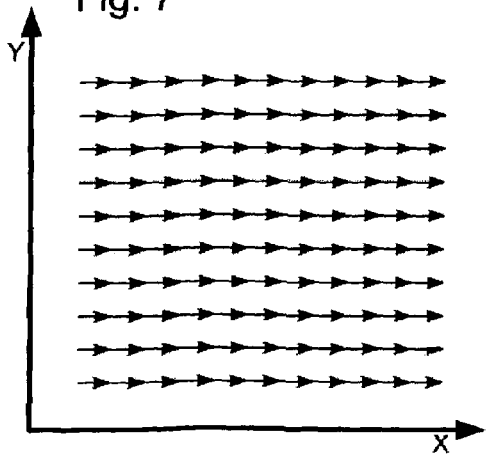
FIGS. 7 to 12 are diagrams illustrating the effects of different deformations of the mask on the image projected on the substrate.
Figure 8:
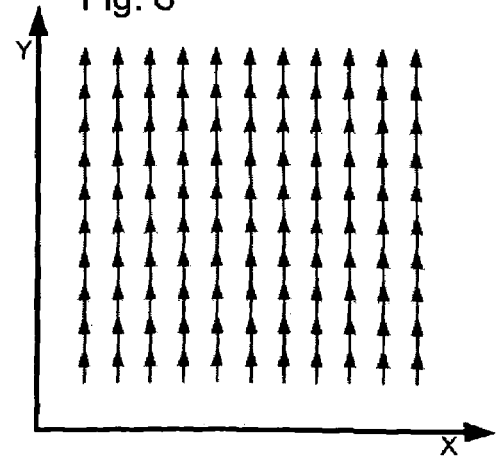
Figure 9:
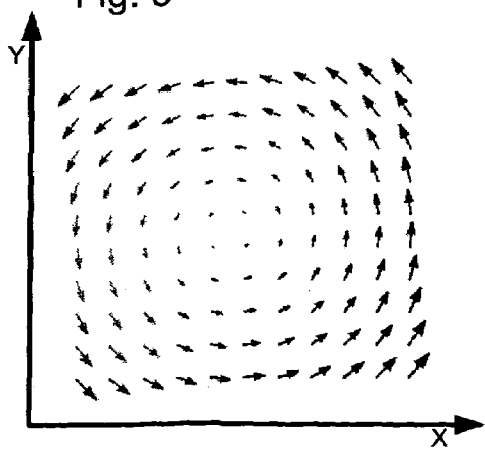
Figure 10:
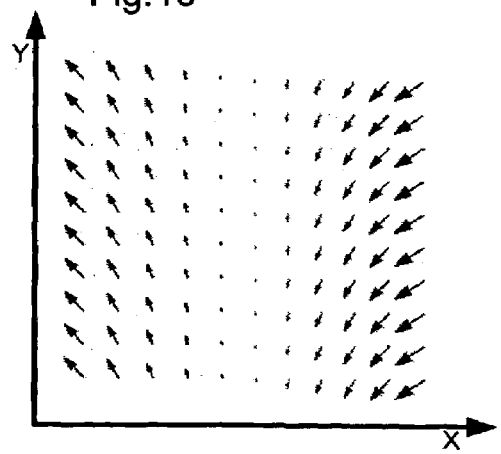
Figure 11:
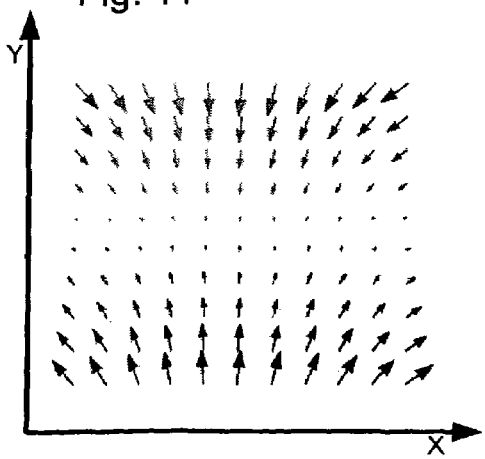

FIGS. 7 to 9 show, respectively, that translation of the mask in the X direction, translation in the Y direction, and rotation about the Z axis (Rz) result in a corresponding shift in the image at wafer level. However, a tilt around the Y-axis (the scanning axis) as shown in FIG. 10 transforms the square array into a parallelogram array (diamond-shaped distortion), and a tilt around the X-axis as shown in FIG. 11 results in a trapezoidal array (parallelogram distortion with change in magnification in Y). A shift of the mask in the Z-direction results in the distortion shown in FIG. 12: a change in magnification in the X-direction together with a non-uniform shift in the Y-direction. A change in magnification in the Y-direction can be obtained by varying the relative scanning speeds of the mask and substrate tables. The shift and tilt of the mask and relative speeds of the mask and substrate tables can be changed continuously during a scan.

The effect shown in FIG. 11 may also be obtained by a tilt of the scanning direction, rather than an actual tilt of the mask about the X axis. This effect depends upon the illuminated part of the mask being above (or below) the object plane at the start of the scan to yield a reduction (or magnification) of the image relative to the normal magnification and on the opposite side of the object plane at the end of the scan to yield the opposite effect. Thus the effect shown in FIG. 11 can be obtained by tilting the mask with respect to the object plane whilst keeping the scanning direction parallel to the object plane, or by maintaining the mask parallel to the object plane and tilting the scanning direction with respect to the object plane.

Figure 12:
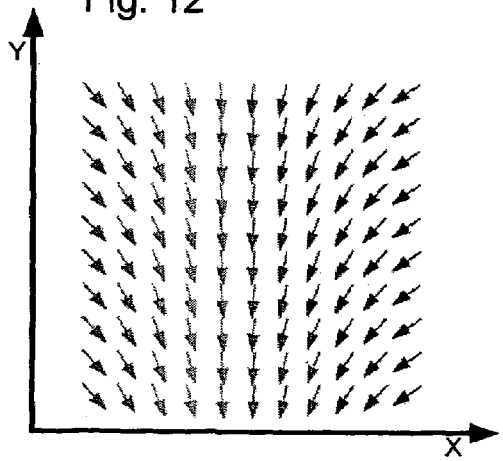

FIGS. 10, 11 and 12 show some arc-shaped distortion, which derives from the fact that the illumination field is arc-shaped. Such distortion may occur when the illuminated part of the mask is displaced from the object plane, or when the ratio of the scanning speeds of the mask and substrate tables is different than the magnification ratio of the projection lens. Where such a distortion is not desirable, it may be counteracted by tilting the mask about the X axis, since the illumination field extends along the X axis. This operation causes the distance between the mask and object plane to differ along the illumination plane so that there will be a non-uniform shift in the XY plane along the illumination field. An appropriate choice of tilt angle can therefore result in substantially no distortion along the X-direction, whilst retaining the other effects illustrated in FIGS. 10, 11 and 12.

Also, with the mask shifted in the Z-direction to give the effect shown in FIG. 12, the mask can be tilted about the X axis and the Z-shift varied so that the distance between the illuminated part of the mask and the object plane is constant. This operation will result in a change in magnification in X and a uniform shift in Y. Corresponding effects can be obtained by varying the relative scanning speeds of mask and substrate tables whilst tilting the mask around the X or Y axes. Varying the tilt about the Y axis while scanning yields a trapezoidal distortion orthogonal to that shown in FIG. 11.

Accordingly, the ability to shift the mask in the Z-direction, to tilt it about the X or Y axes, and to control the relative speeds of mask and substrate tables provides controllable degrees of freedom to compensate for distortions elsewhere in the system. Such distortions may be systematic (i.e. inherent to the machine in question and static between exposures) or transient (i.e. varying between exposures).

Systematic distortions may result from errors of the projection system or deformations of the substrate table that cause deformations of the substrates mounted in them. Values characterizing such distortions, and the mask shifts needed to compensate for them, may be determined during initial calibration of the apparatus and/or periodic re-calibration, e.g. by directly measuring the distortions and calculating the necessary corrections, or by a trial and error process whereby a test reticle is imaged onto test substrates with different shifts and tilts.

Transient distortions may include deformations of the substrate due to previous process steps: for instance, an error introduced in a previous imaging step or a substrate polishing step, or thermal distortions of elements in the projection lens. Values characterizing transient distortions may be directly measured (e.g. during an alignment process for distortions of the substrate) or predicted, and the appropriate shifts and/or tilts of the mask may be calculated in advance or immediately before the relevant exposure.

It will be appreciated that shifts in different directions and tilts about different axes can be combined to compensate for more complex distortions. For example, a non-orthogonal substrate deformation (i.e. a deformation whereby the effective X and Y axes of previous process steps are not perpendicular) may be compensated for by a combination of a translation in the X direction, a rotation about the Z-axis, and a tilt about the X-axis.

The shifts and tilts of this embodiment are global in nature and thus the tilt and scanning direction of the mask are preferably made substantially constant throughout a scanning exposure.

As with the methods described earlier, the necessary tilts and/or shifts of the mask may be accomplished by the positioning structure PM under appropriate software control.

Tilting and/or shifting of the patterning structure provides effective controllable degrees of freedom that enable the operator of the lithographic projection apparatus to introduce deliberate distortions of the projected image to compensate for or adapt to other distortions. Such distortions may include errors in the projection system, for example, and/or distortions of the substrate, which may be caused by previous processed layers. Further, such an operation may also enable the operator to manipulate a deformed mask such that an illuminated part of the mask pattern is positioned in or at least closer to the object plane of the projection system. In particular, where the illumination field is arc-shaped and the mask has a local or global cylindrical or spherical distortion, the mask may be rotated so that the line of intersection between the mask and the object plane lies within the arc-shaped illumination field. With this arrangement, the scanning direction of the mask is preferably rotated by the same amount as the mask. In this way, distortion of the projected image can be substantially reduced.

It will be appreciated that shifts and/or tilts of the mask to compensate for distortions elsewhere in the apparatus, as provided by a method according to one embodiment of the invention, may be combined with shifts and/or tilts necessary to compensate for distortions of the mask, as provided by a method according to another embodiment of the invention. Also, where a perfect compensation for distortions (whether of the mask or elsewhere) is not achievable, the present invention encompasses performing shifts and/or tilts of the mask to effect the best compensation practicable.

Whilst specific embodiments of the invention have been described above, it will be appreciated that the invention as claimed below may be practiced otherwise than as described. It is explicitly noted that the description of these embodiments is not intended to limit the invention as claimed.

What is claimed is:

1. A device manufacturing method, said method comprising:

providing a beam of radiation;

positioning a reflective patterning structure to reflect at least a portion of the provided beam as a patterned beam of radiation having a pattern in its cross-section; and using a projection system to project the patterned beam of radiation to form an image on a target portion of a layer of radiation-sensitive material that at least partially covers a substrate; and determining a distortion value, wherein said positioning includes at least one among shifting and tilting a nominal reflective surface of the reflective patterning structure with respect to a nominal object plane of the projection system according to the determined distortion value.

2. The device manufacturing method according to claim 1, wherein the distortion value is based on a distortion of the reflective patterning structure.

3. The device manufacturing method according to claim 1, wherein the distortion value is based on a distortion of the projection system, said at least one among shifting and tilting is performed according to the distortion of the projection system, and wherein said at least one among shifting and tilting includes applying at least one of the following movements to the nominal reflective surface:

a tilt about an axis substantially parallel to the nominal reflective surface, and a shift in a direction substantially perpendicular to the nominal reflective surface.

4. The device manufacturing method according to claim 1, said method further comprising scanning the reflective patterning structure with the beam of radiation, wherein said scanning includes moving at least one among the reflective patterning structure and the beam of radiation relative to the other.

5. The device manufacturing method according to claim 4, wherein said at least one among shifting and tilting includes tilting a direction of said scanning the reflective patterning structure.

6. The device manufacturing method according to claim 4, said method further comprising scanning the target portion,
wherein said scanning includes moving at least one among the substrate and the patterned beam of radiation relative to the other.

7. The device manufacturing method according to claim 6, wherein a tilt of the patterning structure and a direction of scanning the patterning structure are maintained substantially constant during said scanning the target portion.

8. The device manufacturing method according to claim 1, wherein the reflective patterning structure comprises a mask held on a mask table.

9. The device manufacturing method according to claim 8, wherein the mask includes a plurality of markers surrounding a pattern area, and
wherein said method further comprises:
measuring the positions of the markers, and
determining the shape of the mask in the pattern area according to the measured positions of the markers.

10. The device manufacturing method according to claim 8, said method further comprising:
applying interferometry to measure the position in a direction perpendicular to a nominal plane of the mask of a plurality of points on the reflective surface of the mask, and
determining the shape of the mask according to the measured positions of the plurality of points.

11. The device manufacturing method according to claim 1, wherein said projection beam is of radiation having a wavelength in the range of from 5 to 20 nm.

12. The device manufacturing method according to claim 1, wherein said projection system is non-telecentric on an object side.

13. A device manufactured according to the device manufacturing method according to claim 1.

14. A mask for use in the device manufacturing method according to claim 1, said mask having a plurality of markers surrounding a pattern area.

15. The device manufacturing method according to claim 1, wherein the distortion value is based on a distortion of one or more of the reflective patterning structure, the projection system, or a substrate table configured to support the substrate.

* * * * *